US008927312B2

(12) United States Patent
Chang et al.

(10) Patent No.: US 8,927,312 B2
(45) Date of Patent: Jan. 6, 2015

(54) METHOD OF FABRICATING MEMS TRANSISTORS ON FAR BACK END OF LINE

(71) Applicant: International Business Machines Corporation, Armonk, NY (US)

(72) Inventors: Leland Chang, New York, NY (US); Guy Cohen, Mohegan Lake, NY (US); Michael A. Guillorn, Yorktown Heights, NY (US); Effendi Leobandung, Wappinger Falls, NY (US); Fei Liu, Yorktown Heights, NY (US); Ghavam G. Shahidi, Pound Ridge, NY (US)

(73) Assignee: International Business Machines Corporation, Armonk, NY (US)

( * ) Notice: Subject to any disclaimer, the term of this patent is extended or adjusted under 35 U.S.C. 154(b) by 263 days.

(21) Appl. No.: 13/652,623

(22) Filed: Oct. 16, 2012

(65) Prior Publication Data

US 2014/0106552 A1  Apr. 17, 2014

(51) Int. Cl.
*H01L 21/00* (2006.01)

(52) U.S. Cl.
USPC .............................. 438/52; 257/414; 257/50

(58) Field of Classification Search
USPC ...................................... 257/414; 438/50, 52
See application file for complete search history.

(56) References Cited

U.S. PATENT DOCUMENTS

| | | | |
|---|---|---|---|
| 6,833,597 B2 | 12/2004 | Blasko, III | |
| 7,202,764 B2 | 4/2007 | Deligianni et al. | |
| 7,305,571 B2 | 12/2007 | Cranford, Jr. et al. | |
| 7,514,760 B1 | 4/2009 | Quevy | |
| 7,624,289 B2 | 11/2009 | Cranford, Jr. et al. | |
| 7,943,410 B2 | 5/2011 | LeNeel et al. | |
| 8,053,887 B2 | 11/2011 | Yang | |
| 8,101,469 B2 | 1/2012 | Kumar et al. | |
| 8,124,527 B2 | 2/2012 | Lacey et al. | |

(Continued)

OTHER PUBLICATIONS

"Microelectroechanical systems", http://en.wikipedia.org/wiki/Microelectromechanical_systems; Jul. 11, 2012, 7 pgs.

(Continued)

*Primary Examiner* — Asok K Sarkar
(74) *Attorney, Agent, or Firm* — Harrington & Smith; Louis J. Percello

(57) ABSTRACT

A MEMS transistor for a FBEOL level of a CMOS integrated circuit is disclosed. The MEMS transistor includes a cavity within the integrated circuit. A MEMS cantilever switch having two ends is disposed within the cavity and anchored at least at one of the two ends. A gate and a drain are in a sidewall of the cavity, and are separated from the MEMS cantilever switch by a gap. In response to a voltage applied to the gate, the MEMS cantilever switch moves across the gap in a direction parallel to the plane of the FBEOL level of the CMOS integrated circuit into electrical contact with the drain to permit a current to flow between the source and the drain. Methods for fabricating the MEMS transistor are also disclosed. In accordance with the methods, a MEMS cantilever switch, a gate, and a drain are constructed on a far back end of line (FBEOL) level of a CMOS integrated circuit in a plane parallel to the FBEOL level. The MEMS cantilever switch is separated from the gate and the drain by a sacrificial material, which is ultimately removed to release the MEMS cantilever switch and to provide a gap between the MEMS cantilever switch and the gate and the drain.

16 Claims, 11 Drawing Sheets

(56) References Cited

U.S. PATENT DOCUMENTS

| | | | |
|---|---|---|---|
| 2004/0012057 A1* | 1/2004 | Bennett et al. | 257/414 |
| 2008/0315332 A1* | 12/2008 | Kaelberer et al. | 257/415 |
| 2010/0258882 A1* | 10/2010 | Magnee et al. | 257/415 |
| 2011/0002168 A1 | 1/2011 | Schepens et al. | |
| 2011/0049649 A1* | 3/2011 | Anderson et al. | 257/415 |
| 2011/0067982 A1 | 3/2011 | Schmit et al. | |
| 2012/0138437 A1* | 6/2012 | Ng et al. | 200/181 |
| 2012/0164774 A1* | 6/2012 | Schoen et al. | 438/50 |
| 2012/0326248 A1* | 12/2012 | Daneman et al. | 257/415 |
| 2013/0069178 A1* | 3/2013 | Verheijden et al. | 257/415 |
| 2014/0103422 A1* | 4/2014 | Chang et al. | 257/329 |

OTHER PUBLICATIONS

"MEMS transistor integrated on CMOS", R. colin Johnson, Dec. 6, 2011, 1 pg.

* cited by examiner

METHOD OF FABRICATING MEMS TRANSISTORS ON FAR BACK END OF LINE

TECHNICAL FIELD

This disclosure relates generally to the formation of a microelectromechanical systems (MEMS) device in a complementary metal oxide semiconductor (CMOS) back end of line (BEOL) process.

BACKGROUND

In central processing unit (CPU) chips, parts of the circuit are generally put down by power gating techniques when not operated to save power. Under current technology, high threshold voltage field effect transistors (FETs) are used for the power gating. It has been found, in practice, that a considerable amount of power is wasted due to voltage drop on BEOL wiring between power gating transistors and the shut down circuit.

In accordance with the present invention, MEMS transistors are constructed in the far back end of line (FBEOL) for use instead of transistors, such as standard FETs, which cannot be built at BEOL, and can only be built at the front end of line (FEOL).

SUMMARY

In an exemplary embodiment, a MEMS transistor in a far back end of line (FBEOL) level of a CMOS integrated circuit is disclosed. The MEMS transistor includes a cavity within the integrated circuit. A MEMS cantilever switch having two ends is disposed within the cavity and anchored at least at one of the two ends, and is electrically coupled to a source for the MEMS transistor. A gate and a drain are in a sidewall of the cavity, and are separated in a direction parallel to the plane of the FBEOL level of the CMOS integrated circuit from the MEMS cantilever switch by a gap. In response to an appropriate gate signal, the MEMS cantilever switch moves across the gap in a direction parallel to the plane of the FBEOL level of the CMOS integrated circuit into electrical contact with the drain to permit a current to flow between the source and the drain.

In another exemplary embodiment, a CMOS integrated circuit includes at least one MEMS transistor as described in the preceding paragraph.

In another exemplary embodiment, a method for fabricating a MEMS transistor in a far back end of line (FBEOL) level of a CMOS integrated circuit is disclosed. In accordance with the method, a first cavity is formed within a first oxide layer in the FBEOL level of the CMOS integrated circuit. The first cavity is then filled with a sacrificial material, such as polysilicon. The first oxide layer and first cavity are next covered with a first dielectric layer, which is then covered by a second oxide layer. Subsequently, a second cavity is formed in the first dielectric layer and the second oxide layer, and is at least in part contiguous with the first cavity. The side walls of the second cavity are then lined with the sacrificial material. A third cavity and a fourth cavity are formed next to one of the side walls of the second cavity in the first dielectric layer and the second oxide layer in a direction parallel to the plane of the FBEOL level of the CMOS integrated circuit. The sacrificial material on the side wall of the second cavity separates the second cavity from the third and fourth cavities. The second, third, and fourth cavities are filled with an electrically conducting material to form a MEMS cantilever switch, a gate, and a drain, respectively. The second cavity, including the side walls and the MEMS cantilever switch, are then covered with the sacrificial material. The second oxide layer, the sacrificial material, and the gate and the drain are next covered with a second dielectric layer, and the second dielectric layer is covered with a third oxide layer. Finally, a vent hole is provided at least through the second dielectric layer and the third oxide layer to the sacrificial material, and the sacrificial material, including the sacrificial material on the side wall of the second cavity, is removed through the vent hole with a solvent to release the MEMS cantilever switch and to provide a gap between the MEMS cantilever switch and the gate and the drain, enabling it to move into contact with the drain when required.

In still another exemplary embodiment, another method for fabricating a MEMS transistor in a far back end of line (FBEOL) level of a CMOS integrated circuit is disclosed. In accordance with this method, a first cavity is formed within an oxide layer in the FBEOL level of said CMOS integrated circuit. The first cavity is then lined with a sacrificial material to form a layer of the sacrificial material therein. A second cavity and a third cavity are then formed next to one of the side walls of the first cavity in a direction parallel to the plane of the FBEOL level of the CMOS integrated circuit. The sacrificial material on the side wall of the first cavity separates the first cavity from the second and third cavities. The first, second, and third cavities are filled with an electrically conducting material to form a MEMS cantilever switch, a gate, and a drain. At least a portion of the first cavity is then covered with the sacrificial material, the portion including the MEMS cantilever switch within the first cavity. The sacrificial material is then covered with a layer of a dielectric material. A vent hole is then provided through the dielectric material to the sacrificial material, and the sacrificial material, including the sacrificial material on the side wall of the first cavity, is removed through the vent hole with a solvent to release the MEMS cantilever switch and to provide a gap between the MEMS cantilever switch and the gate and the drain, enabling it to move into contact with the drain when required.

BRIEF DESCRIPTION OF THE DRAWINGS

The foregoing and other aspects of these teachings are made more evident in the following detailed description, when read in conjunction with the attached drawing figures.

DETAILED DESCRIPTION

As noted above, the present invention generally relates to the formation of a MEMS cantilever switch in a complementary metal oxide semiconductor (CMOS) back end of line (BEOL) process. As such, the MEMS cantilever switch of the present invention may be formed during a standard BEOL process. In FIGS. 1A to 1Q and 2A to 2I, the fabrication of the MEMS cantilever switch is illustrated on the right-hand side thereof, while that of a representative BEOL device is illustrated on the left-hand side.

Figure 1A:
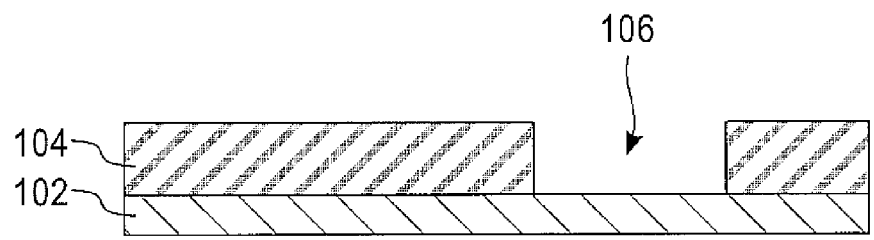
FIGS. 1A through 1Q illustrate the fabrication of a MEMS cantilever switch in accordance with a first method of the present invention.

FIG. 1A is a cross-sectional view of the initial steps in the manufacture of a MEMS cantilever switch according to a first embodiment of the present invention. It should be understood that the various layers illustrated in FIG. 1A and in subsequent figures of the first embodiment are above or on top of front end of line (FEOL) layers and several levels of BEOL, which, for the sake of simplicity, are not shown. A dielectric layer 102 is first deposited on the FEOL or lower BEOL layers and an oxide (such as silicon oxide) layer 104 is deposited on dielectric layer 102. The dielectric may be, for example, nitride, such as silicon nitride, or NBLOK (nitrogen-doped silicon carbide). The oxide layer 104 is then covered with a photoresist, which is exposed to light and removed in predetermined areas. Following reactive-ion etching (RIE), a cavity 106 is formed in the oxide layer 104, extending down to dielectric layer 102.

Figure 1B:
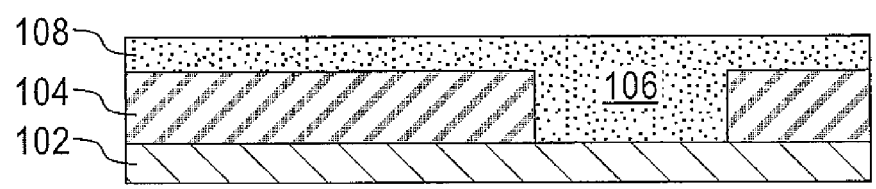
Figure 1C:
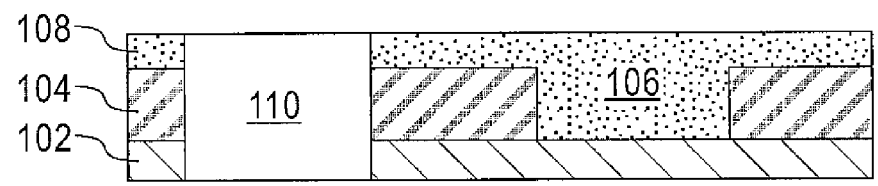

Next, as shown in FIG. 1B, a polysilicon layer 108 is deposited on oxide layer 104, the polysilicon also filling cavity 106. A photoresist layer is then deposited on the polysilicon layer 108, exposed to light and removed in predetermined areas, and, following reactive-ion etching (RIE), a cavity 110 is formed in the dielectric layer 102, the oxide layer 104 and polysilicon layer 108, extending down to the FEOL layers or lower BEOL layers, not shown. Cavity 110 is formed for a device manufactured during a standard BEOL process, which may proceed during the manufacture of the MEMS cantilever switch of the present invention, as shown in FIG. 1C.

Figure 1D:
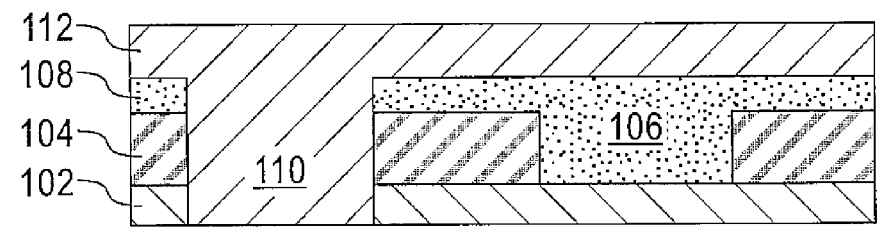
Figure 1E:
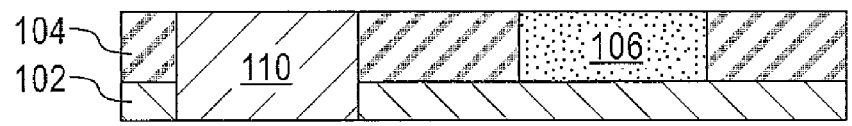

A layer 112 of an electrically conducting material is plated onto polysilicon layer 108, filling cavity 110, as shown in the cross-sectional view of FIG. 1D. The electrically conducting material may be a metal, such as aluminum, copper, gold, or mixtures thereof. Polysilicon layer 108 and copper layer 112 are then removed by chemical mechanical polishing/planarization (CMP), leaving polysilicon in cavity 106 and electrically conducting material in cavity 110, as shown in FIG. 1E.

Figure 1F:
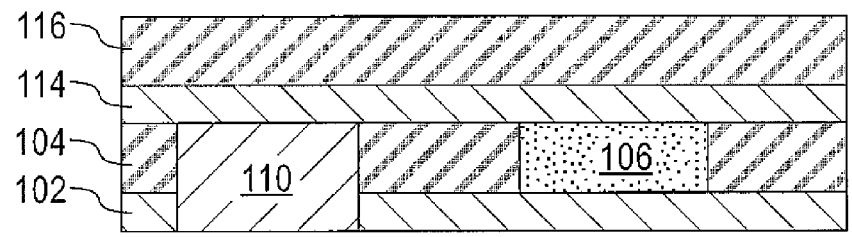
Figure 1G:
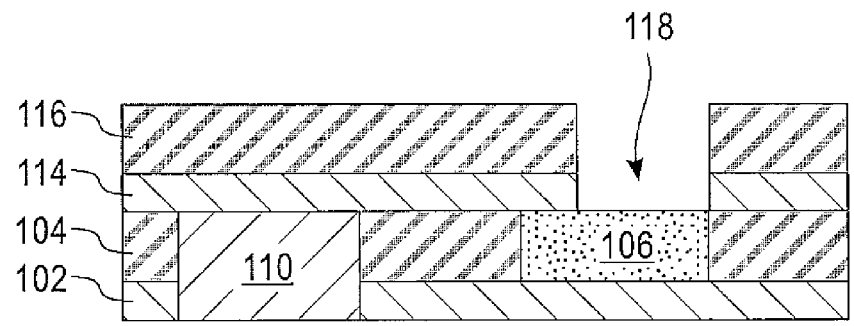
Figure 1H:
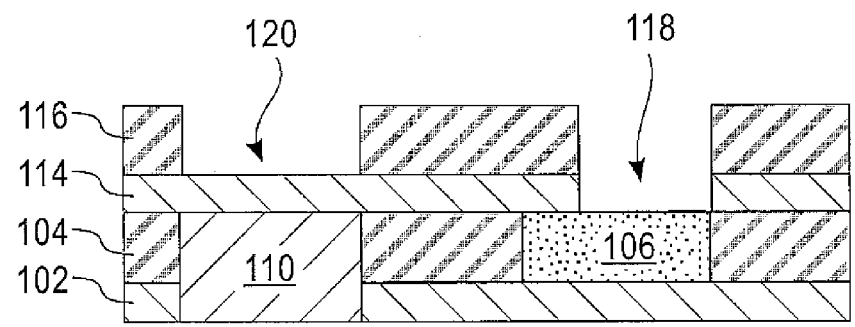

Next, a dielectric layer 114 is deposited on oxide layer 104 covering cavity 106 (previously filled with polysilicon) and cavity 110 (filled with electrically conducting material), and an oxide layer 116 is deposited on dielectric layer 114, as shown in FIG. 1F. The oxide layer 116 is then covered with a photoresist, which is exposed to light and removed in predetermined areas. Following reactive-ion etching (RIB), a cavity 118 is formed in the dielectric layer 114 and the oxide layer 116, extending down to cavity 106 (filled with polysilicon), as shown in FIG. 1G.

The structure shown in FIG. 1G is again covered with a photoresist, including cavity 118. The photoresist is exposed to light and removed in predetermined areas. Following reactive-ion etching (RIE), a cavity 120 is formed in oxide layer 116, extending down to dielectric layer 114, for a device manufactured during a standard BEOL process.

Figure 1I:
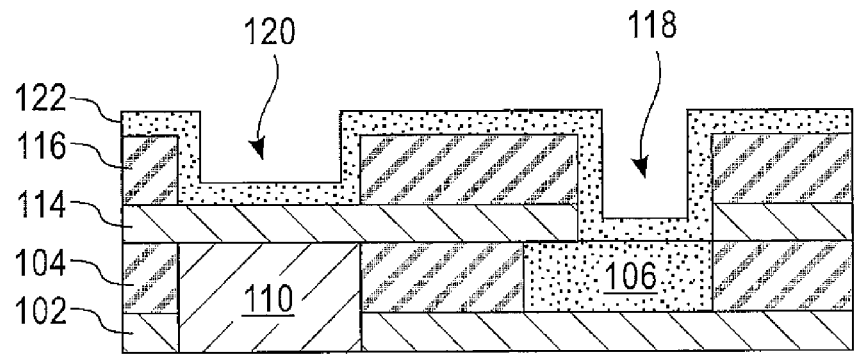
Figure 1J:
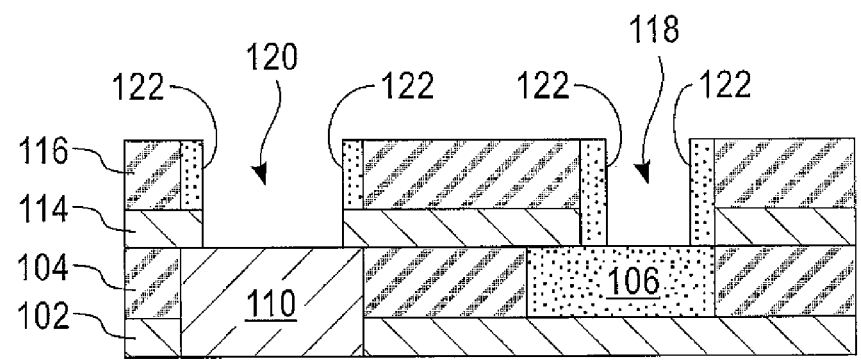

Next, a polysilicon layer 122 is deposited onto oxide layer 116 and lines the sides and bottoms of cavities 118, 120, as shown in FIG. 1I. Directional reactive-ion etching (RIE) is used to form polysilicon liner sidewall 122. Following RIB, cavity 118 is left with sidewalls having polysilicon layer 122 and cavity 120 has been deepened down to cavity 110 (previously filled with electrically conducting material), as shown in FIG. 1J.

Figure 1K:
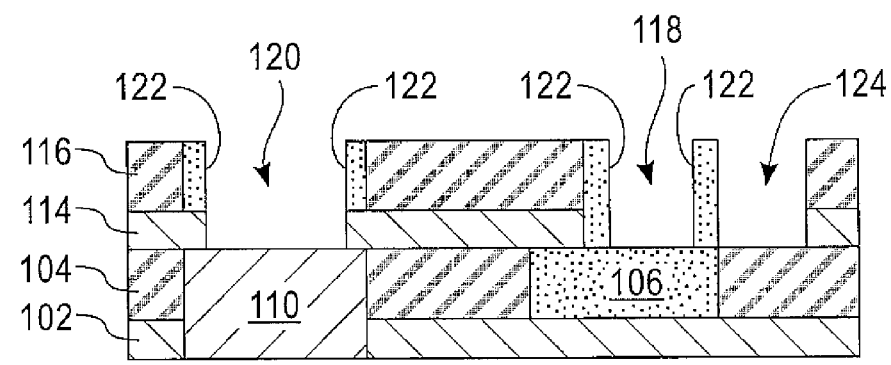

Referring now to FIG. 1K, the structure shown in FIG. 1J is again covered with a photoresist, including cavities 118, 120, exposed to light and removed in predetermined areas. Following reactive-ion etching, cavity 124 is formed in dielectric layer 114 and oxide layer 116, and extends down to oxide layer 104. As shown in FIG. 1K, side wall 122 separates cavity 118 from cavity 124. Ultimately, as will be shown in the figures to follow, the gap between the MEMS cantilever and the gate and the drain results from the thickness of side wall 122. As a consequence, a gap having a width in a range from 1.0 nanometer (nm) to 1.0 micrometer (µm) can be readily achieved.

Figure 1L:
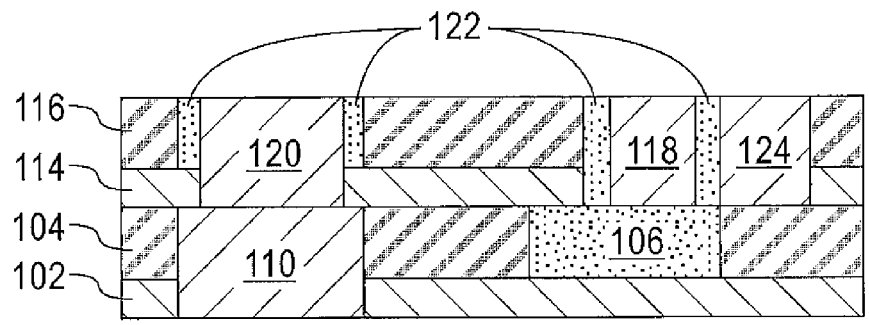

As was done earlier in the steps shown in FIGS. 1D and 1E, a layer of electrically conducting material is plated onto oxide layer 116 and the upstanding remnants of polysilicon layer 122, filling cavities 118, 120, 124. The layer of electrically conducting material is then removed by chemical mechanical polishing/planarization (CMP), leaving electrically conducting material in cavities 118, 120, 124, as shown in FIG. 1L.

Figure 1M:
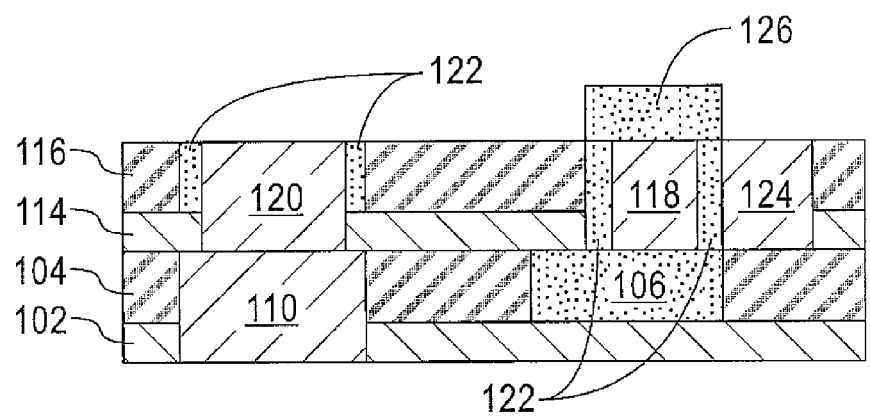

Next, a polysilicon layer 126 is applied onto oxide layer 116, cavities 118, 120, 124 (all filled with electrically conducting material), and polysilicon side walls 122, and removed everywhere except over cavity 118 (filled with electrically conducting material) and side walls 122 on both sides of cavity 118, leaving the structure shown in FIG. 1M.

Figure 1N:
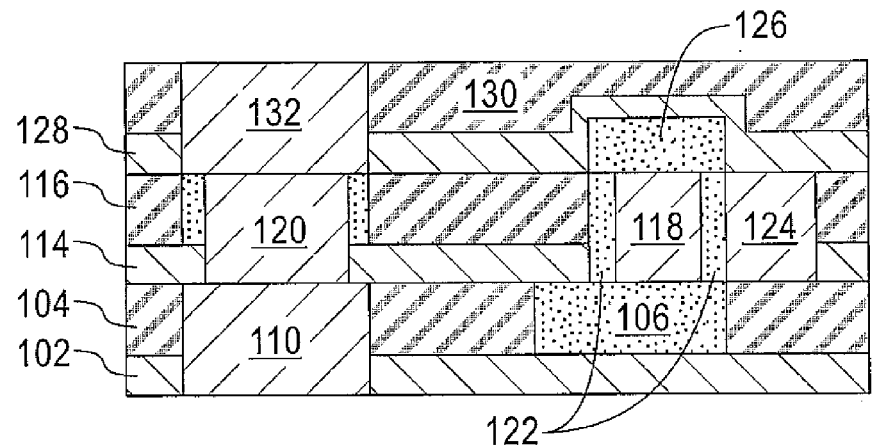

FIG. 1N shows a cross-sectional view of the structure after several additional steps have been carried out on that shown in FIG. 1M. Firstly, dielectric layer 128 is deposited onto oxide layer 116 and polysilicon layer 126 covering cavity 118 (filled with electrically conducting material), including cavities 120, 124 (both filled with electrically conducting material). Then, an oxide layer 130 is deposited onto dielectric layer 128. Subsequently, a photoresist is applied to the surface of oxide layer 130, exposed to light and removed in predetermined areas. Following reactive-ion etching (RIE), a cavity 132 is formed, and extends down to cavity 120 (previously filled with electrically conducting material). After the remaining photoresist is removed, a layer of electrically conducting material is plated onto oxide layer 130, filling cavity 132. The layer of electrically conducting material is then removed by chemical mechanical polishing/planarization (CMP), leaving electrically conducting material in cavity 132, as shown in FIG. 1N. This is typical for a standard FBEOL process.

Figure 1O:
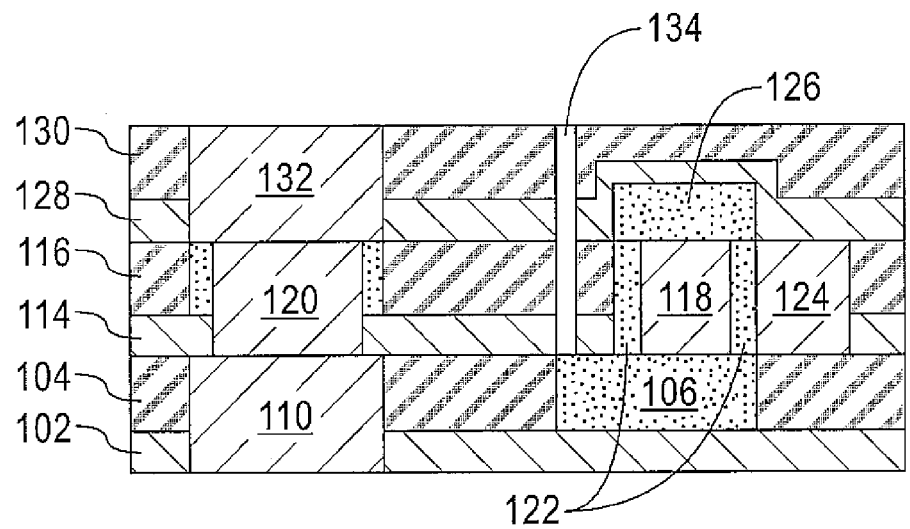

Turning now to FIG. 1O, vent holes 134 are provided by applying a photoresist to the surface of oxide layer 130 and cavity 132 (filled with electrically conducting material), exposing the photoresist to light in the predetermined locations for vent holes 134, and performing reactive-ion etching (RIE) to provide the vent holes to the depth desired, in this case, down through oxide layer 130, dielectric layer 128, oxide layer 116, and dielectric layer 114, to cavity 106 (previously filled with polysilicon). It should be observed that cavity 106, side walls 122 on either side of cavity 118 (filled with electrically conducting material), and polysilicon layer 126 form a single contiguous volume filled with polysilicon within the structure shown in FIG. 1O. Vent holes 134 may have diameters in the micrometer range.

Figure 1P:
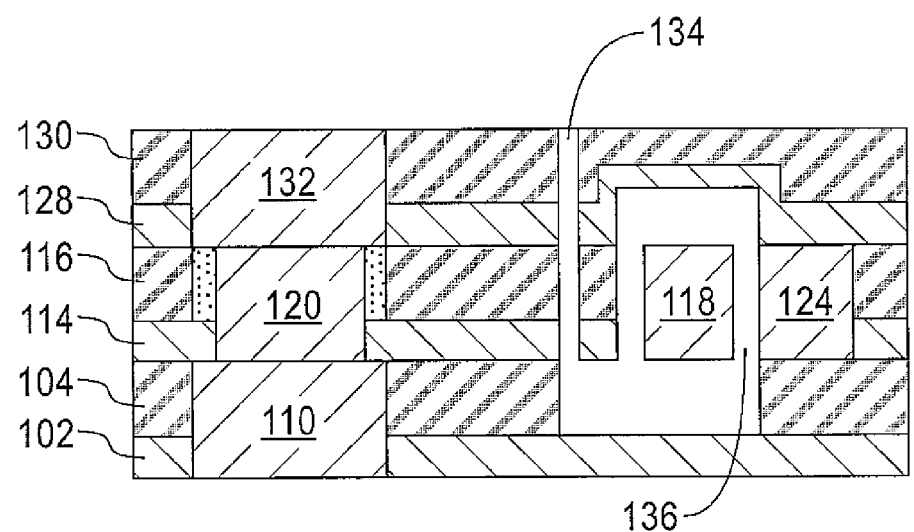

In FIG. 1P, a suitable solvent is introduced down vent hole 134 to dissolve this sacrificial polysilicon material to release the MEMS cantilever switch 118 (formerly a cavity filled with electrically conducting material). Cavity 124 is now a drain or gate separated from the MEMS cantilever switch 118 by gap 136. Finally, in FIG. 1Q, a top layer 138 is added on top of the structure to seal the vent hole 134, so that foreign matter, such as dust particles or moisture, will not interfere with the operation of MEMS cantilever switch 118. Top layer 138 may be of any material, such as, metal, oxide, dielectric, or plastic, depending upon what might be needed for additional structure that may be provided above that shown.

Figure 2A:
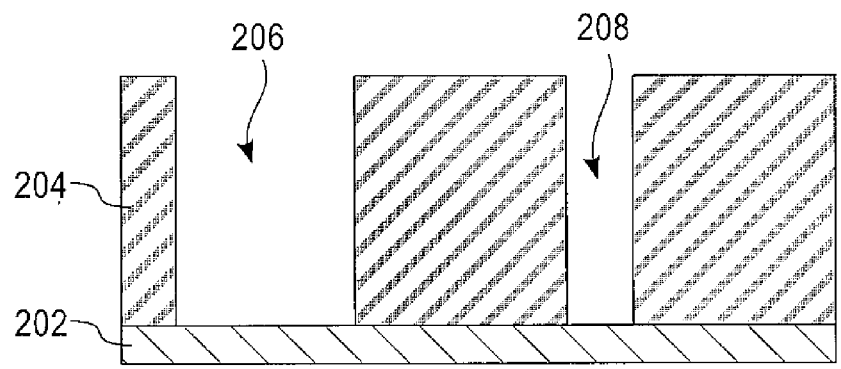
FIGS. 2A through 2I illustrate the fabrication of a MEMS cantilever switch in accordance with a second method of the present invention.

FIG. 2A is a cross-sectional view of the initial steps in the manufacture of a MEMS cantilever switch according to a second embodiment of the present invention. It should again be understood that the various layers illustrated in FIG. 2A and in subsequent figures of the second embodiment are above or on top of front end of line (FEOL) layers and several levels of BEOL, which, for the sake of simplicity, are not shown. A dielectric layer 202 is first deposited on the FEOL or lower BEOL layers, and an oxide layer 204 is deposited on dielectric layer 202. The oxide layer 204 is then covered with a photoresist, which is exposed to light and removed in predetermined areas. Following reactive-ion etching (RIE) in the predetermined areas, cavities 206, 208 are formed in the oxide layer 204, extending down to dielectric layer 202.

Figure 2B:
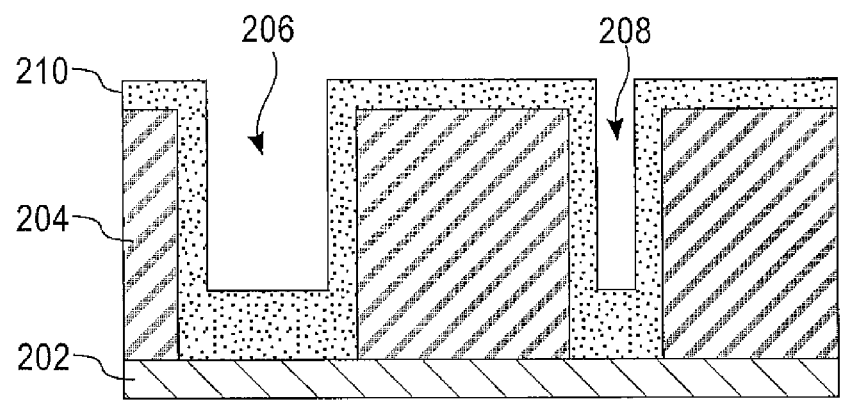
Figure 2C:
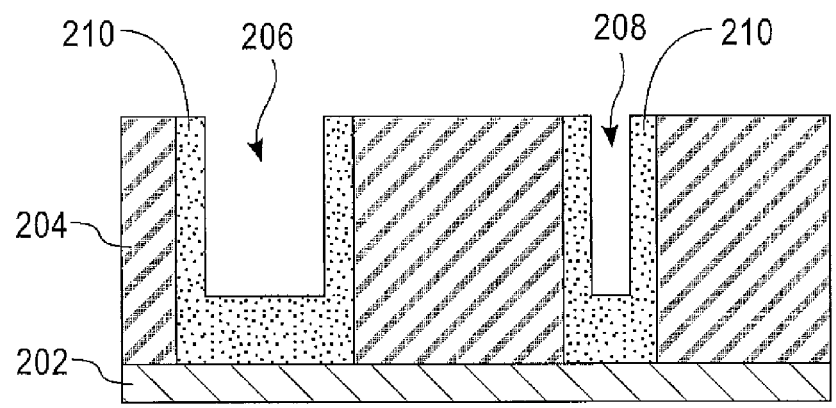

Referring to FIG. 2B, a non-conformal polysilicon (or amorphous silicon) layer 210 is then deposited on oxide layer 204 and into cavities 206, 208. The layer 210 is non-conformal to the extent that it is thicker on the bottom of the cavities 206, 208 than it is on the side walls of the cavities 206, 208. In FIG. 2C, the result of performing chemical mechanical polishing/planarization (CMP) on the polysilicon layer 210 down to the surface of the oxide layer 204 is shown.

Figure 2D:
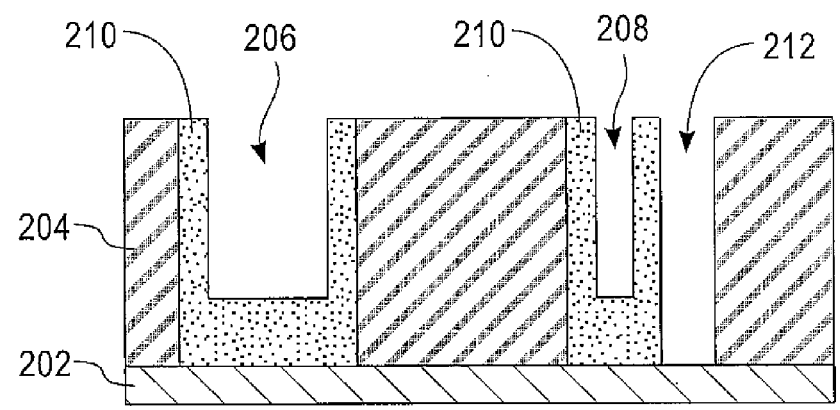

To obtain the structure shown in FIG. 2D, the oxide layer 204, polysilicon layer 210 and cavities 206, 208 are covered with a photoresist, which is exposed to light and removed in predetermined areas. Following reactive-ion etching (RIE) in the predetermined areas, a cavity 212 is formed in the oxide layer 204, extending down to dielectric layer 202.

Figure 2E:
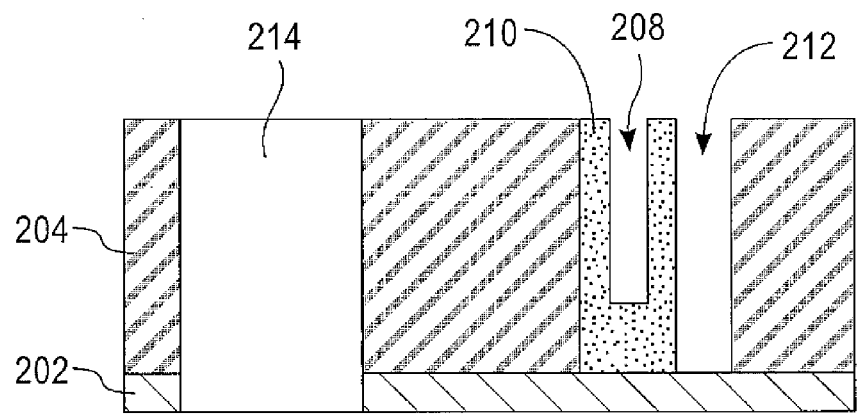

Next, a photoresist layer is deposited on the oxide layer 204 and polysilicon layer 210, filling cavities 206, 208, 212, and exposed to light and removed in predetermined areas. Following reactive-ion etching (RIE), a cavity 214 is formed by removing polysilicon layer 210 in cavity 206 and dielectric layer 202 to extend down to the lower BEOL layers or the FEOL layers, not shown in the figure. Cavity 214 is formed for a device manufactured during a standard BEOL process, which may proceed during the manufacture of the MEMS cantilever switch of the present invention. The structure resulting from this step is shown in FIG. 2E.

A layer of electrically conducting material is plated onto oxide layer 204, filling cavities 208, 212, 214. The layer of electrically conducting material is then removed by chemical mechanical polishing/planarization (CMP), leaving electrically conducting material in cavities 208, 212, 214, as shown in FIG. 2F.

Figure 2F:
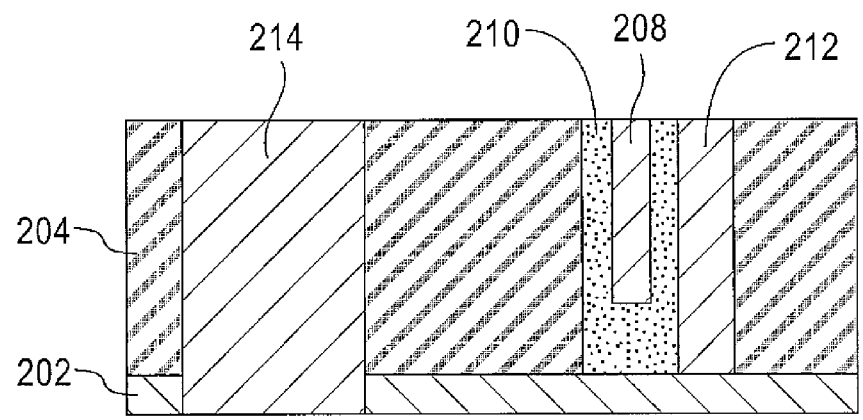
Figure 2G:
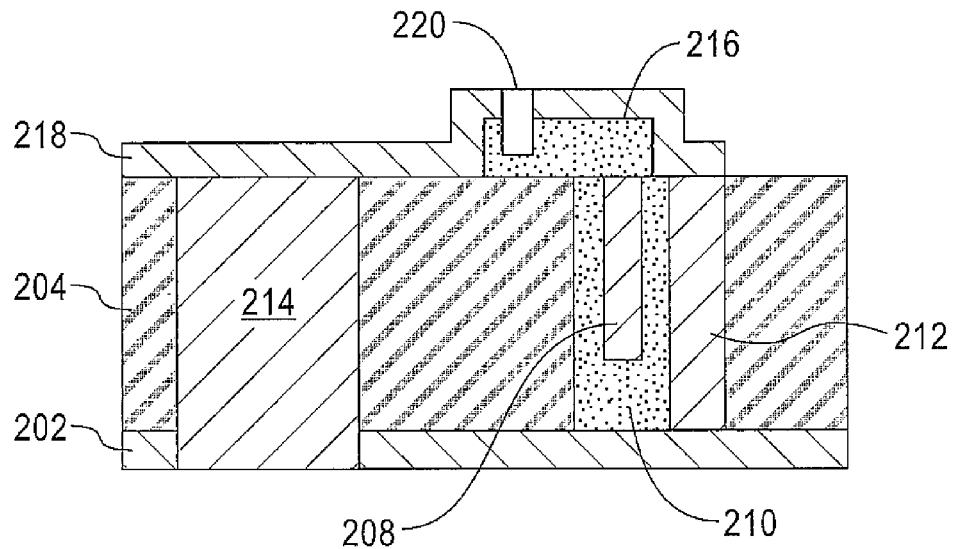

FIG. 2G shows the structure after several additional steps are carried out on that shown in FIG. 2F. First, a polysilicon layer 216 is applied onto oxide layer 204, cavities 208, 212, 214 (all filled with electrically conducting material), and polysilicon 210, and removed everywhere except over cavity 208 (filled with electrically conducting material) and polysilicon layer 210. Then, a dielectric layer 218 is deposited onto oxide layer 204, cavities 212, 214 (previously filled with electrically conducting material) and polysilicon layer 216, as shown in FIG. 2G. Subsequently, vent hole 220 is provided by applying a photoresist to the surface of dielectric layer 218 and oxide layer 204, exposing the photoresist to light in the predetermined locations for vent holes 220, and performing reactive-ion etching (RIE) to provide the vent holes 220 to the depth desired, in this case, down through dielectric layer 218 to polysilicon layer 216. It should be observed that polysilicon layer 210 and polysilicon layer 216 form a single contiguous volume within the structure.

Figure 2H:
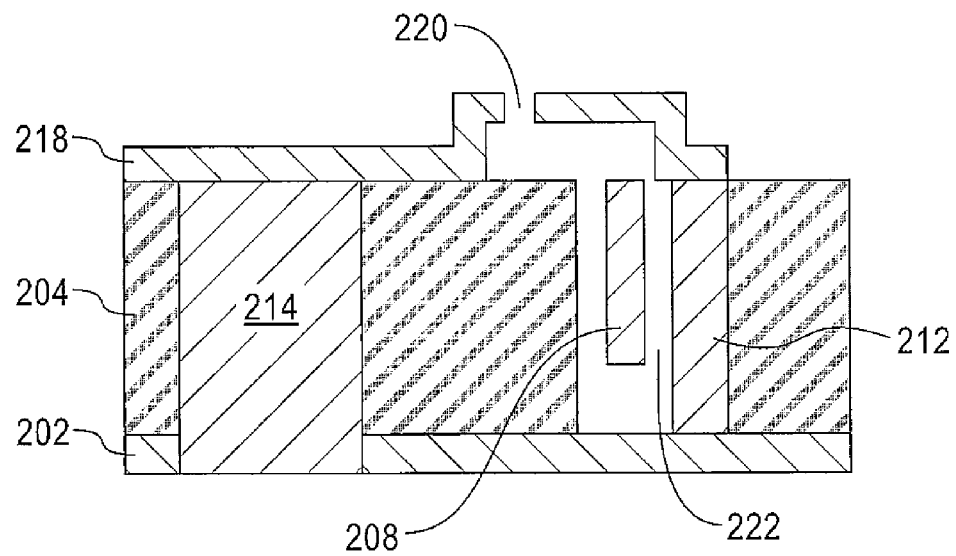

In FIG. 2H, a suitable solvent is introduced down vent hole 220 to dissolve this polysilicon material to release the MEMS cantilever switch 208 (formerly a cavity filled with electrically conducting material). Cavity 212 is now a drain or gate separated from the MEMS cantilever switch 208 by gap 222. As previously shown, the width of gap 222, between MEMS cantilever switch 208 and the drain/gate electrode 212, results from the thickness of the polysilicon layer 210 between cavities 208, 212. As a consequence, a gap having a width in a range from 1.0 nanometer (nm) to 1.0 micrometer (μm) can be readily achieved.

Figure 2I:
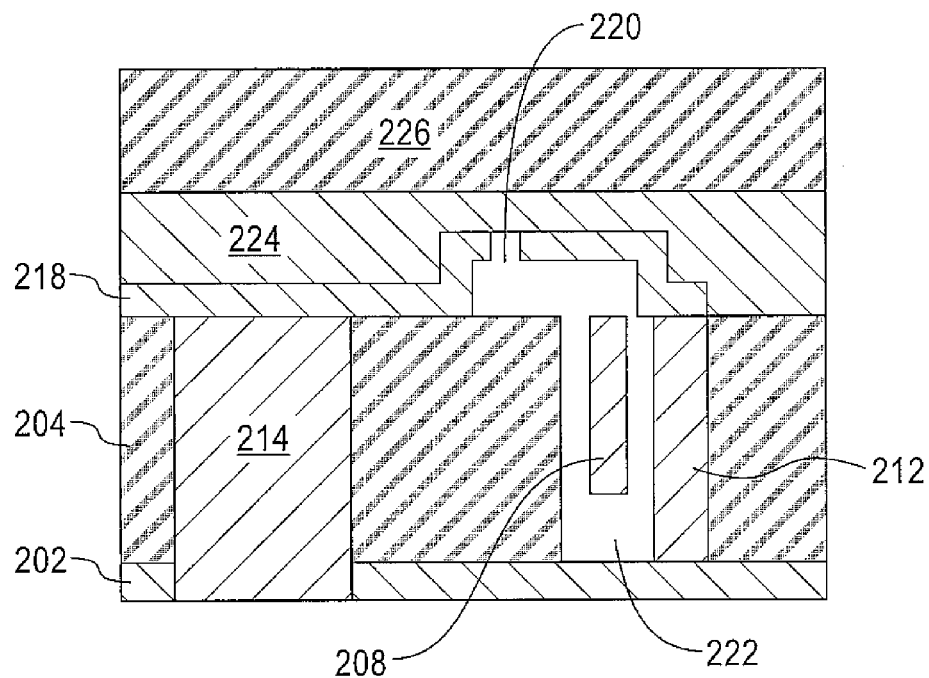

Finally, in FIG. 2I, a dielectric layer 224 is added on top of the structure to seal the vent hole 220, so that foreign matter, such as dust particles or moisture, will not interfere with the operation of MEMS cantilever switch 208, and an oxide layer 226 is deposited on dielectric layer 224, so that additional structure that may be provided above that shown.

It should be recalled that all of the preceding FIGS. 1A to 1Q, and 2A to 2I are cross-sectional views taken through the layered semiconductor structure at a point suitable for demonstrating how the MEMS cantilever switch is released when the sacrificial polysilicon material is removed. In fact, the MEMS cantilever switch of the present invention must be anchored at one or both ends in order to be able to carry out the function for which it is intended.

Figure 3:
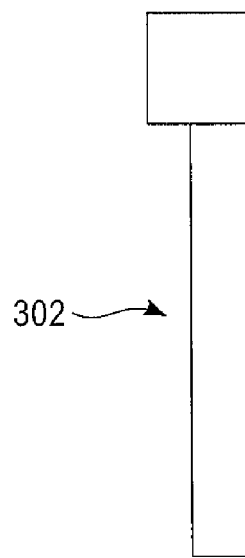
FIG. 3 is a plan view of a MEMS cantilever switch designed to be anchored at one end.

FIG. 3 is a plan view of a MEMS cantilever switch 302 which is designed to be anchored at one end, specifically, at end 304, which would not have been enclosed by polysilicon sacrificial material during the manufacturing steps outlined above. The width of the MEMS cantilever switch 302 may be in a range from 10 nanometers (nm) to 100 micrometers (μm), while the length may be anywhere in a range from 1 to 10,000 micrometers (μm). The MEMS cantilever switch 302 may be provided with a tip at the drain side for improved contact.

Figure 4:
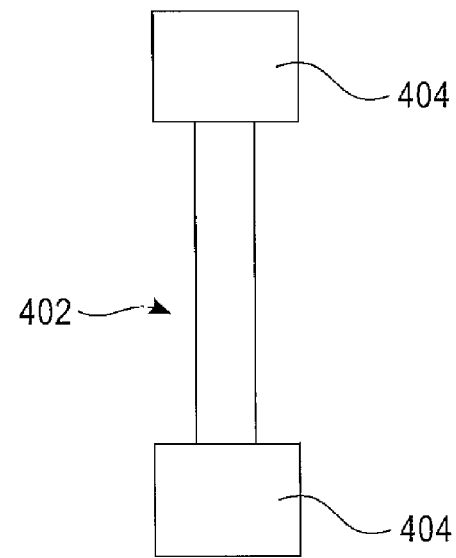
FIG. 4 is a plan view of a MEMS cantilever switch designed to be anchored at both ends.

FIG. 4 is a plan view of a MEMS cantilever switch 402 which is designed to be anchored at both ends to prevent out-of-plane bending due to residual stress. In this case, both ends 404 would not have been enclosed by polysilicon sacrificial material during the manufacturing steps outlined above. As above, the width of the MEMS cantilever switch may be in a range from 10 nanometers (nm) to 100 micrometers (μm), while the length may be anywhere in a range from 1 to 10,000 micrometers (μm).

Figure 5:
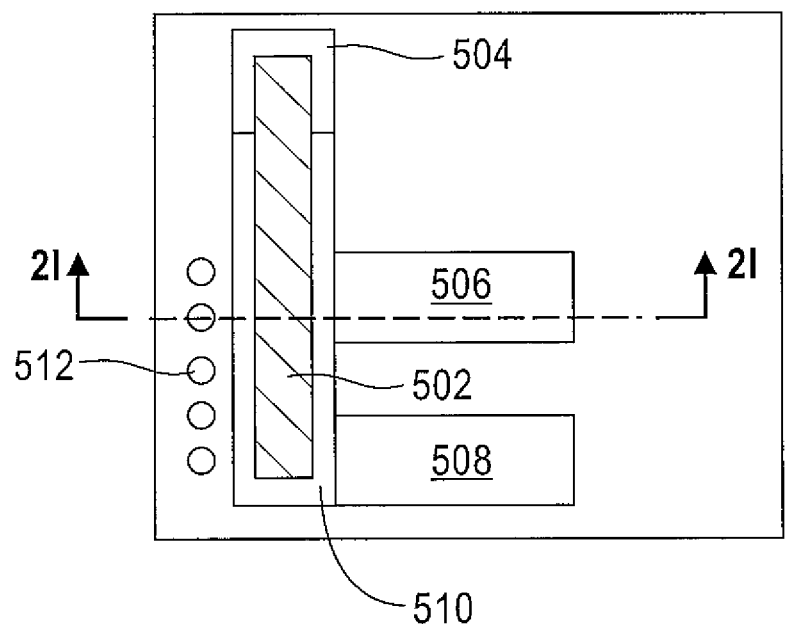
FIG. 5 is a schematic plan view of a MEMS cantilever switch anchored at one end and separated from a drain by a gap.

FIG. 5 is a schematic plan view of a MEMS cantilever switch 502 anchored at one end 504 and separated from gate 506 and drain 508 by a gap 510, which, as described above, may have a width in a range from 1.0 nanometer (nm) to 1.0 micrometer (μm). In response to an appropriate signal, MEMS cantilever switch 502 shifts to the right to come into contact with drain 508 to permit current to flow between source and drain. Gap 510 corresponds to gap 222 shown in FIGS. 2H and 2I. Vent holes 512 correspond to vent hole 220 shown in FIGS. 2G through 2I, although it will be recalled that vent hole 220 is ultimately sealed, as shown in FIG. 2I, so that foreign matter, such as dust particles or moisture, will not interfere with the operation of MEMS cantilever switch 208. The cross section taken as indicated in FIG. 5 gives the right-hand side of FIG. 2I, where the MEMS cantilever switch 208 corresponds to MEMS cantilever switch 502, and electrode 212 corresponds to gate 506.

Figure 1Q:
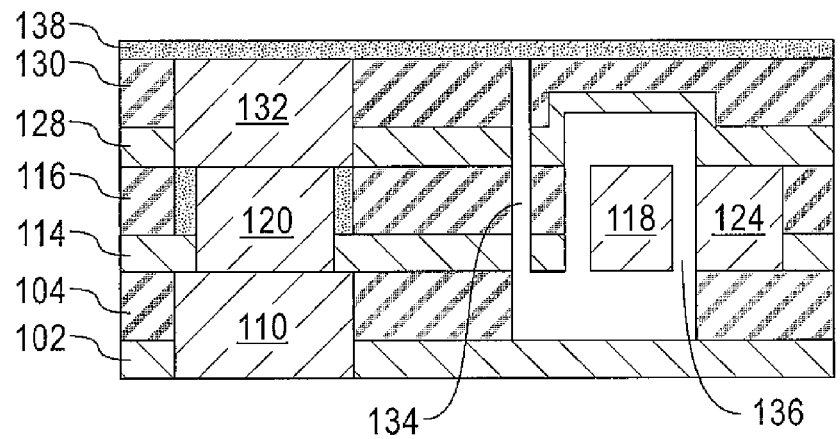
Figure 6:
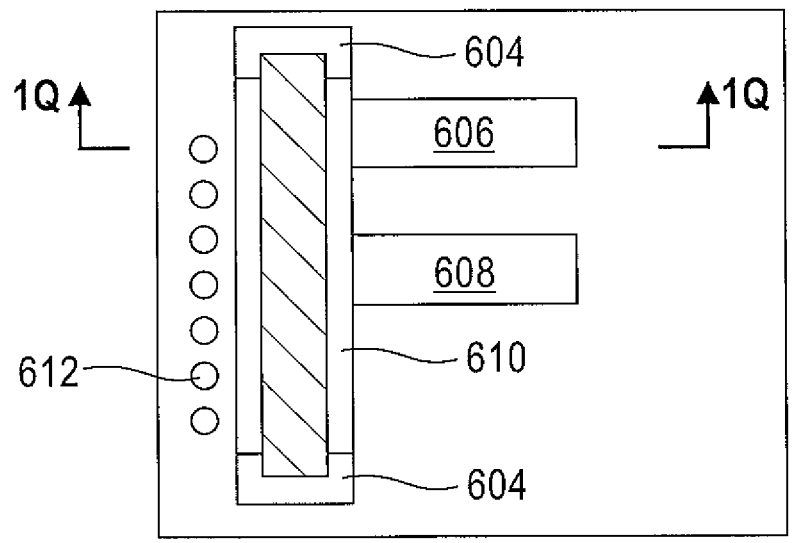
FIG. 6 is a schematic plan view, similar to that of FIG. 5, of a MEMS cantilever switch anchored at both ends and separated from a drain by a gap.

FIG. 6 is a schematic plan view of a MEMS cantilever switch 602 anchored at both ends 604 and separated from gate 606 and drain 608 by a gap 610. In response to an appropriate signal, MEMS cantilever switch 602 shifts to the right to come into contact drain 608 to permit current to flow between them for a desired interval, in other words, by opening a gate between them mechanically. Gap 610 corresponds to gap 136 shown in FIGS. 1P and 1Q. Vent holes 612 correspond to vent hole 134 shown in FIGS. 1O through 1Q, although it will be recalled that vent hole 134 is ultimately sealed, as shown in FIG. 1Q, so that foreign matter, such as dust particles or moisture, will not interfere with the operation of MEMS cantilever switch 118. The cross section taken as indicated in FIG. 6 gives the right-hand side of FIG. 1Q, where the MEMS cantilever switch 118 corresponds to MEMS cantilever switch 602, and electrode 124 corresponds to gate 606.

By providing the MEMS cantilever switches in CMOS integrated circuits instead of the customary FETs in the far back end of line to function as power gating transistors, a noticeable benefit from an "on" resistance perspective can be obtained. For example, the "on" resistance of the MEMS transistor can be in the range from approximately 0.1 to 0.2 ohm, which is about five times lower than the "on" resistance of the FETs used for gating purposes. Moreover, leakage for the MEMS transistor will be zero, as opposed to that of the FET, which is approximately 10 µA. The latter can result in a large loss of power, as there may be thousands of such devices in a single integrated circuit.

Various modifications and adaptations may become apparent to those skilled in the relevant arts in view of the foregoing description, when read in conjunction with the accompanying drawings. However, any and all modifications of the teachings of this disclosure will still fall within the scope of the non-limiting embodiments of this invention.

Although described in the context of particular embodiments, it will be apparent to those skilled in the art that a number of modifications and various changes to these teachings may occur. Thus, while the invention has been particularly shown and described with respect to one or more embodiments thereof, it will be understood by those skilled in the art that certain modifications or changes may be made therein without departing from the scope of the invention as set forth above, or from the scope of the claims to follow.

What is claimed is:

1. A method for fabricating a MEMS (micro-electromechanical systems) transistor in a far back end of line (FBEOL) level of a CMOS (complementary metal-oxide-semiconductor) integrated circuit, said method comprising:
   forming a first cavity within a first oxide layer in said FBEOL level of said CMOS integrated circuit;
   filling said first cavity with a sacrificial material;
   covering said first oxide layer and said first cavity with a first dielectric layer;
   covering said first dielectric layer with a second oxide layer;
   forming a second cavity in said first dielectric layer and said second oxide layer, said second cavity being at least in part contiguous with said first cavity;
   lining side walls of said second cavity with said sacrificial material;
   forming a third cavity and a fourth cavity next to one of said side walls of said second cavity in said first dielectric layer and said second oxide layer in a direction parallel to the plane of said FBEOL level of said CMOS integrated circuit, said sacrificial material on said one of said side walls of said second cavity separating said second cavity from said third and fourth cavities;
   filling said second, third, and fourth cavities with an electrically conducting material to form a MEMS cantilever switch, a gate, and a drain, respectively;
   covering said second cavity, including said side walls and said MEMS cantilever switch, with said sacrificial material;
   covering said second oxide layer, said sacrificial material, and said gate and said drain with a second dielectric layer;
   covering said second dielectric layer with a third oxide layer;
   providing a vent hole at least through said second dielectric layer and said third oxide layer to said sacrificial material; and
   removing said sacrificial material, including said sacrificial material on said one of said side walls of said second cavity, through said vent hole with a solvent to release said MEMS cantilever switch and to provide a gap between said MEMS cantilever switch and said gate and said drain.

2. The method as claimed in claim 1, further comprising the step of covering said third oxide layer with an additional layer to seal said vent hole.

3. The method as claimed in claim 1, wherein said sacrificial material is polysilicon.

4. The method as claimed in claim 1, wherein said side wall of said second cavity, next to said third and fourth cavities, has a uniform thickness in a range from a nanometer to a micrometer.

5. The method as claimed in claim 1, wherein said electrically conducting material is a metal.

6. The method as claimed in claim 5, wherein said metal includes at least one of aluminum, copper, and gold.

7. The method as claimed in claim 1, wherein said first, second, and third oxide layers comprise silicon oxide.

8. The method as claimed in claim 1, wherein said first and second dielectric layers comprise at least one of silicon nitride and nitrogen-doped silicon carbide (NBLOK).

9. A method for fabricating a MEMS (micro-electromechanical systems) transistor in a far back end of line (FBEOL) level of a CMOS (complementary metal-oxide-semiconductor) integrated circuit, said method comprising:
   forming a first cavity within an oxide layer in said FBEOL level of said CMOS integrated circuit;
   lining said first cavity with a sacrificial material to form a layer of said sacrificial material therein;
   forming a second cavity and a third cavity next to one of said side walls of said first cavity in a direction parallel to the plane of said FBEOL level of said CMOS integrated circuit, said sacrificial material on said one of said side walls of said first cavity separating said first cavity from said second and third cavities;
   filling said first, second, and third cavities with an electrically conducting material to form a MEMS cantilever switch, a gate, and a drain;
   covering at least a portion of said first cavity with said sacrificial material, said portion including said MEMS cantilever switch within said first cavity;
   covering said sacrificial material with a layer of dielectric material;
   providing a vent hole through said dielectric material; and
   removing said sacrificial material, including said sacrificial material on said one of said side walls of said first cavity, through said vent hole with a solvent to release said MEMS cantilever switch and to provide a gap between said MEMS cantilever switch and said gate and said drain.

10. The method as claimed in claim 9, further comprising the step of covering said third oxide layer with an additional layer to seal said vent hole.

11. The method as claimed in claim 9, wherein said sacrificial material is polysilicon.

12. The method as claimed in claim 9, wherein said side wall of said first cavity, next to said second and third cavities, has a uniform thickness in a range from a nanometer to a micrometer.

13. The method as claimed in claim 9, wherein said electrically conducting material is a metal.

14. The method as claimed in claim 13, wherein said metal includes at least one of aluminum, copper, and gold.

15. The method as claimed in claim 9, wherein said oxide layer comprises silicon oxide.

16. The method as claimed in claim 9, wherein said dielectric material comprises at least one of silicon nitride and nitrogen-doped silicon carbide (NBLOK).

* * * * *